United States Patent [19]

Drabing et al.

[11] 4,125,763
[45] Nov. 14, 1978

[54] AUTOMATIC TESTER FOR MICROPROCESSOR BOARD

[75] Inventors: Richard B. Drabing, Santa Clara; Tim Y. Lam; Charles Q. Hoard, both of Sunnyvale, all of Calif.

[73] Assignee: Fluke Trendar Corporation, Mountain View, Calif.

[21] Appl. No.: 815,961

[22] Filed: Jul. 15, 1977

[51] Int. Cl.² .................... G06F 11/00; G01R 31/00
[52] U.S. Cl. ................................ 235/302; 324/73 R
[58] Field of Search ......... 235/302; 324/73 R, 73 AT

[56] References Cited

U.S. PATENT DOCUMENTS

| | | | |
|---|---|---|---|
| 3,831,149 | 8/1974 | Job | 235/302 |
| 3,832,535 | 8/1974 | De Vito | 235/302 |
| 3,873,818 | 3/1975 | Barnard | 235/302 |
| 3,924,109 | 12/1975 | Jhu et al. | 235/302 |
| 3,931,506 | 1/1976 | Borrelli et al. | 235/302 |
| 4,012,625 | 3/1977 | Bowen et al. | 235/302 |

*Primary Examiner*—Charles E. Atkinson
*Attorney, Agent, or Firm*—Townsend and Townsend

[57] ABSTRACT

An apparatus for testing circuit board systems utilizing microprocessors which includes means for selectively exercising each terminal or pin of the board system during each step of the testing protocol. Each step of the protocol can be preselected to operate according to an automatic sequence or according to a preprogrammed manner, or the apparatus may be conditioned to receive a response from the circuit board system at a selected terminal during a selected step of the testing protocol. The testing apparatus further includes an interactive interface to permit the board system under test to control the speed and sequence of the test procedure. The testing apparatus is capable of exercising the board systems under test in a simulated environment at typically normal operating speeds so that degradation of system performance related to operational speed and other factors found in an operating environment can be analyzed.

19 Claims, 4 Drawing Figures

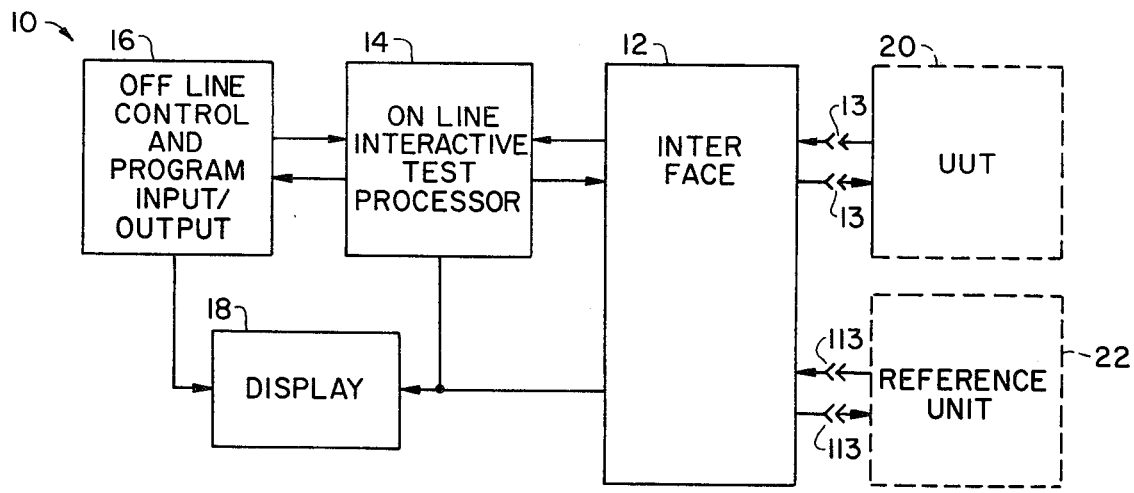
FIG._1.
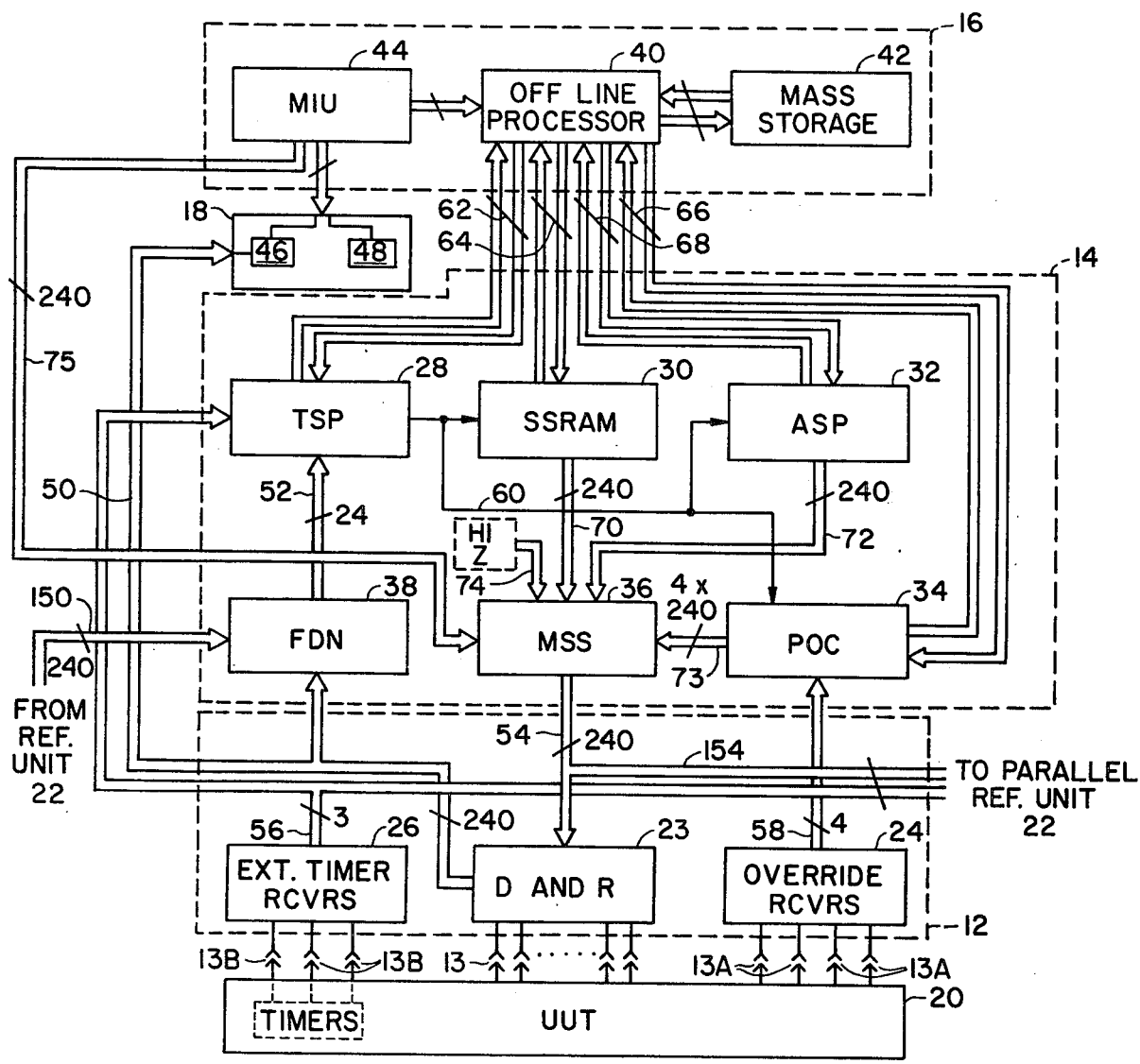
FIG._2.

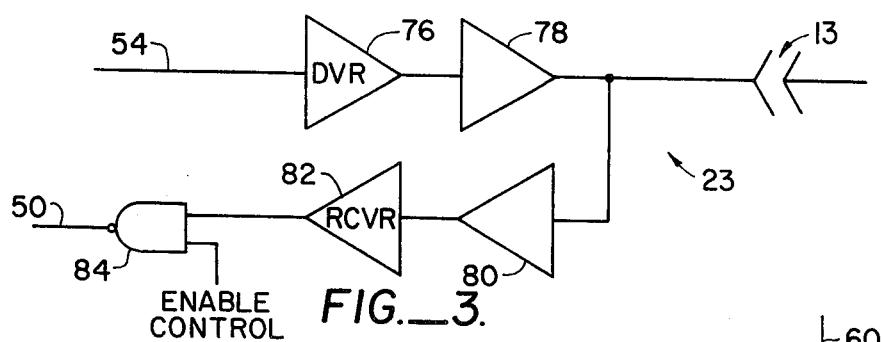
FIG._3.
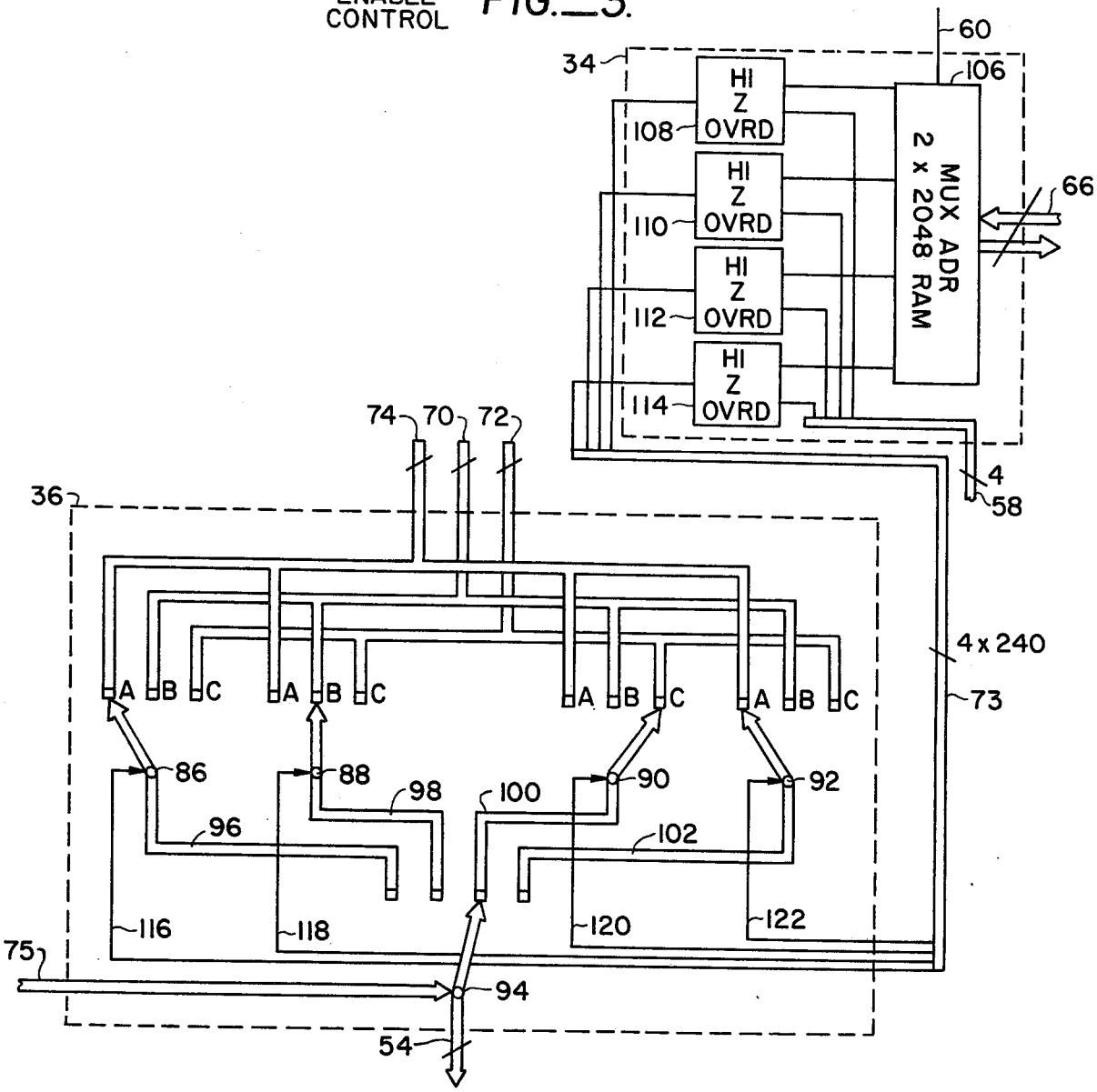
FIG._4.

AUTOMATIC TESTER FOR MICROPROCESSOR BOARD

BACKGROUND OF THE INVENTION

This invention relates to digital circuit testing apparatus and particularly to a system for testing circuit boards containing microprocessor units.

In the specialized field of digital circuit diagnostic analysis, there has developed a need for a capability to rapidly and automatically test complex circuit boards under operating conditions. Automatic testers are known for analyzing the operation of discrete components or integrated circuit components which may be mounted to circuit boards as part of a more complex system.

Heretofore, it has not been possible to test microprocessor based boards under normal operating conditions or in a simulated operating environment because of the unique capabilities and demands of microprocessor based systems. Microprocessors are often considered in the art to be "intelligent", that is, a microprocessor unit in its operational environment has the capability of responding to digital data from and providing a digitally processed output to peripheral circuit units such that real time, quasi-intelligent interaction between the system and the external environment is possible. Furthermore, the relatively small cost and compact size of a microprocessor makes dedicated application of computerized systems a practical possibility. A general purpose digital computer is unsuited in many such dedicated applications. A microprocessor based system is generally not independent of its environment. Therefore, there is a need to test microprocessor-based circuit boards in an interactive environment simulating operating conditions.

General purpose digital computers have been suggested as a means for testing microprocessor based systems. However, a general purpose digital computer based system, which is preprogrammed to exercise a microprocessor based system in a diagnostic environment is typically too slow in operation to effectively interact with the microprocessor based system. Furthermore, the general purpose digital computers are generally not capable of operating under the timing control of external circuitry, such as a microprocessor based system. Thus, general purpose digital computer based systems are unsuited for thoroughly testing microprocessor based systems in real time.

SUMMARY OF THE INVENTION

To overcome many of the above-mentioned shortcomings and to provide a practical system for interactive analysis of microprocessor based systems, the present invention provides an automatic microprocessor board testing apparatus which includes means for selectively exercising each pin of the microprocessor board system during each step of a testing protocol. Each step of the testing protocol can be preselected to perform in a specified manner. For example, the step may be selected to operate according to a preprogrammed operating sequence, or according to an automatic operating sequence, for instance, in response to a pulse generator or other digital signal generators, or it may be programmed so that selected pins or terminals of the circuit system under test are conditioned for providing a response from the circuitry under test.

The inventive testing apparatus is capable of exercising board systems under test in a simulated operating environment at typically normal operating speeds so that degradation of system performance related to operational speed can be analyzed.

One of the purposes of this invention is to provide a versatile, general purpose, digital diagnostic machine capable of testing microprocessor based units, intelligent logic circuit boards, and other circuit boards in which dynamic interaction between the tester and tested circuit is feasible. The apparatus herein described provides a plurality of general purpose diagnostic tools which can be readily interconnected, either manually or automatically, in order to simulate the operating environment of the units to be tested while at the same time to provide means for analyzing the response of the unit under test.

A further particular advantage of the system according to the present invention is an ability to provide interactive communication between the tester and the board under test. In other words, the system under test can control the operation of the diagnostic apparatus. This is made possible because the diagnostic apparatus can operate at the rate and speed of the system under test, and is adapted to operate under external timing control.

A further advantage of the apparatus according to the invention is the ability to intermix automatic sequence testing patterns and stored sequence testing patterns at the operating speeds of the system under test. Automatic test sequence patterns, that is, patterns generated according to a fixed or psuedo random sequence have in the past been the primary source of stimulation for testing circuit systems at rated speeds. Stored sequence patterns, that is, sequences which have been programmed to operate in a preselected pattern calculated to exercise a unit under test according to a preselected sequence, are generally provided by programmed general purpose digital computers.

BRIEF DESCRIPTION OF THE DRAWINGS

The invention will be best understood by reference to the following detailed description taken in conjunction with the accompanying drawings, in which:

FIG. 1 is a generalized block diagram of the testing apparatus;

FIG. 2 is a detailed functional block diagram of the testing apparatus illustrating the elements of the invention;

FIG. 3 is a schematic diagram of one element of the apparatus; and

FIG. 4 is a figurative block diagram of a further element of the apparatus.

DETAILED DESCRIPTION OF THE PREFERRED EMBODIMENTS

The apparatus according to the invention is a versatile tool which can be used for complex diagnosis of microprocessor-based circuit boards by a test engineer or for simple go/no go testing by a semi-skilled assembly line worker.

With reference to FIG. 1, the apparatus is a tester 10, comprising four general functional elements, namely, an interface 12, an interactive test processor 14, an off-line controller 16, and a display 18.

The interface 12 connects to a board or unit under test (UUT) 20 through pins 13, and optionally to a known good reference unit 22 through pins 113, depending upon the requirements of the testing configuration. The interface 12 couples between the UUT 20 and the interactive test processor 14. The test processor 14 allows dynamic interaction, or "hand-shaking" between diagnostic exciters within the processor 14 and the UUT 20.

The processor 14 is coupled to the display 18. The display 18 comprises all binary indicators associated with the individual terminals of the UUT 20, as well as binary indicators associated with control and program switching and alpha-numerical readout panels, which are used for tabulating sequential transition counts, including program steps, clock counts, and board-edge signatures. (Signatures are transition count totals generated at board output terminals in response to preselected diagnostic sequences.)

The tester 10 is arranged so that the supporting logic control is transparent to the test operator monitoring the UUT 20. The off-line controller 16 is coupled to the test processor 14 for loading and for receiving programming instructions and data off-line in preparation for a diagnostic exercise of the UUT 20. The controller 16 includes an instruction keyboard (not shown), front panel switches (not shown) corresponding to each pin 13 of the UUT 20, and switches and keys (not shown) for study of program functions. The controller 16 allows apparent keyboard and front panel access to the individual pins or terminals of the unit under test 20.

Turning to FIG. 2, a functional block diagram of the tester 10 is shown. Each of the basic elements is illustrated together with descriptive functional blocks of features within each of the elements. The tester 10 will be described with reference to a specific embodiment having general purpose capabilities. However, it should be understood that the dimensions disclosed are for the purpose of example only, and are not intended to limit the general applicability of the invention. In particular, the tester 10 is described with reference to a specific embodiment having the capability of exercising and receiving digital information from a UUT 20 having up to 240 terminals. Each terminal can be conditioned to respond to any succession of 2048 (2K) program steps or interactions. In the art, the tester is descriptively termed as programmable at each terminal or pin 13 with a program sequence which is 2048 words "deep".

The UUT 20 connects with the interface 12 which couples to the test processor 14. The test processor 14 is coupled to the off-line controller 16 and to the display 18. The controller 16 is similarly coupled to the display 18. The tester 10 has two basic control modes: off-line control, wherein the controller 16, test processor 14 and display 18 are functionally interconnected, and on-line control, wherein the test processor 14 and the unit under test 20 are interconnected through the interface 12, the display 18 providing a direct indication of performance of the unit under test through the interface 12.

The interface 12 includes three types of function blocks, namely, bi-directional drivers and receivers 23, external bus control receivers 24 and external timing control receivers 26. The drivers and receivers 23 may be coupled to and from all front panel pins 13 to connect to any terminal of the unit under test 20. The external bus control receivers A may be connected to any of a selected number of the front panel pins 13. In the preferred embodiment four front panel connections 13A are provided. Th external timing control receivers 26 may also be connected to any of the selected number of front panel pins. In the selected embodiment three pins 13B are provided.

The on-line test processor 14 comprises six function blocks, namely a test step processor (TSP) 28, a stored sequence random access memory (SSRAM) 30, an auto sequence processor and RAM (ASP) 32, a program operation contoller (POC) 34, a merged sequencing switch (MSS) 36, and a fail detection network (FDN) 38. The TSP 28 is a TTL central processing unit (CPU), which is coupled with working memory such as a 2048 word RAM.

The stored sequence RAM 30 is a 240 × 2048 bit RAM. The ASP 32 is a psuedo-random digital signal synthesizer capable of generating dynamic test sequences under either internal or external clock control. One such digital signal synthesizer is incorporated into the Model 3010 circuit board tester manufactured and sold by the assignee of the present invention.

The POC 34 and the MSS 36, form together a multi-channel time division data multiplexer. The MSS 36 is a digitally-implemented equivalent of 4,240 gauged 3 position switches which operate under control of the POC 34. The POC 34 includes a 4 × 2 × 2048 bit RAM subject to external override control. The FDN 38 may be a multiple-channel input go/no go test network. A preferred embodiment is a parallel cyclic redundancy check network such as a parallel CRC generator used to detect errors in data transmission systems. One such detecting network is described in an article by K. M. Helness, *Computer Design*, March 1974, p. 91.

The off-line controller 16 comprises an off-line CPU 40, mass storage 42, such as a floppy disk, and a manual input unit 44, including a keyboard (not shown) and front panel switches (not shown).

The display 18 includes front panel display 46 and keyboard display 48. The front panel display 46 may be a matrix of lights, and the keyboard display 48 may be an alpha-numeric readout.

The drivers and receivers 23 are monitored by means of a display bus 50 coupled to the front panel display 46. Signals provided by the display bus 50 are also provided to FDN 38 for fail detection analysis, the output of which is provided via a control line 52 to the TSP 28.

A driver bus 54 is coupled between the MSS 36 and the drivers of unit 22. A parallel driver bus 154 having an equal number of channels may be coupled to parallel drivers and receivers (not shown) for driving a known good reference unit (22 FIG. 1). Similarly, a parallel receiver bus 150 may be connected to the FDN 38 from parallel receivers (not shown).

An external timing control bus 56 is coupled between timing control receivers 26 and TSP 28. Also, an external control override bus 58 is coupled from the four external bus control receivers 24 to the POC 34.

The TSP 28 is operative for "internal" program control, that is, the TSP operates independently of the off-line control processor 40. TSP specifically provides for clocking and addressing of the SSRAM 30, the ASP 32, and the POC 34 via signal line 60 to direct information and control signals to the MSS 36. The TSP 28 is also coupled for off-line communication with off-line control processor 40 via a control bus 62. The RAM units of TSP 28, SSRAM 30, ASP 32 and POC 34 are adapted to be loaded either through mass storage 42 or the MIU 44. For this purpose the mass storage 42 and MIU 44 are coupled through the off-line CPU 40 via buses 62, 64, 66, and 68 to the TSP 28, the SSRAM 30, the POC 34 and the ASP 32, respectively. These buses may also be used for writing the contents from all of the working memories of the test processor 14 to mass storage 42. The SSRAM 30 and the ASP 32 are coupled into the MSS 36 via 240 bit wide buses 70 and 72, respectively, to provide two of three possible channels for data input through the data multiplexer formed by the MSS 36 and the POC 34. A third "channel" or state is established by a high impedance or Hi Z input load 74, which is figuratively represented as a third channel. In practice, the Hi Z input is a default condition of the input to MSS 36 in the absence of a connection to either the SSRAM 30 or the ASP 32.

Finally, the POC 32 is coupled to the MSS 36 through a 4 × 240 bit or programmable multiplexing (MUX) bus 73, and the MIU 44 is coupled to the MSS 36 via a presettable MUX bus 75, the functions of which will be clarified in conjunction with a discussion of FIG. 4.

With this outline of the major functional elements and interconnectors, reference is made to FIG. 3 for a more detailed description of the functional elements of the invention. According to the invention, user-defined test sequences and psuedo-random automatic test sequences can be intermixed under program or external control at a speed matching the instruction-execution times of micro-computer control boards. In addition, the apparatus according to the invention provides interface and control capabilities for dynamic large scale integrated circuit logic so that a unit under test 20 may clock the test apparatus and control the instant and sequence of the test protocol, where appropriate.

The drivers and receivers 23 comprise 240 parallel pairs of digital signal driving and receiving circuits coupled to a common terminal. By way of example, FIG. 3 illustrates a single signal line having a driver circuit 76, such as a Texas Instrument type 75367, which is coupled between a line of the driver bus 54 and a buffer 78, which is coupled to a pin 13 at the front panel. The same pin 13 is coupled to a second or receiver buffer 80 which is input to a receiver circuit 82, such as an RCA type 4009 CMOS receiver. The output of the receiver circuit 82 is coupled through an enable gate 84 into a line of receiver bus 50. The enable gate 84 permits the individual pins to be remotely programmed for reception of data from the UUT 20, for example through the MSS 36 and the POC 34.

FIG. 4 is a functional representation of the MSS 36 and the POC 34 forming the time multiplexing unit for the outputs of SSRAM 30, ASP 32 and the Hi Z (Receive Mode) "channel" 74 directed to input/output control drivers and receivers 23. The MSS 36 is in general terms the equivalent of a set of 4 × 240 ganged three-position switches 86, 88, 90 and 92 wherein at a first level three switch positions, A, B, and C, can be changed under program control in the course of a test sequence.

In addition, the equivalent of a second level of 240 four-position switches 94 is provided in series with the four ranks of the program controlled switches 86, 88, 90 and 92. The second level of switches 94 is not program controlled, but rather each switch 94 may be preset off-line via bus 75 from the MIU 44 to provide the signal pattern supplied to one of the trunk lines 96, 98, 100, 102 of the program controllable switches 86, 88, 90 and 92. In this manner selected groups of pins 13 can be programmed to be exercised independently of other groups of pins, since a plurality, e.g., four, independent programmed sequences are provided for.

The operation of the program control switches 86, 88, 90 and 92 is directed by the POC 34. The POC 34 comprises an address register of MUT ADR 106 consisting of a stack of four 2 × 2048 bit RAMs, each location of which contains a 2 bit address designating which of the three possible input sources 70, 72, 74 is to be routed to the four trunk buses 96, 98, 100, 102.

The MUX ADR 106 is loaded and is readable off-line via bus 66. On line control is implemented through control line 60 which selects which of the 2048 possible addresses is to be activated.

In summary, the iteration sequence is under control of the TSP 28, and the MUX ADR 106 controls the time sequential intermixing of diagnostic data through the MSS 36 from signal channels 70, 72 and 74. An important art feature is that the data merging function is subject to real-time, on-line control via the POC 34, which greatly enhances the ability of the tester to interact with the UUT 20.

The POC 34 also includes a feature permitting external override of any one of four ganged switches 86, 88, 90 or 92. Specifically, a bank of four high impendance override elements of Hi Z OVRD 108, 110, 112 and 114 operate to automatically switch the corresponding control lines 116, 118, 120, 127 to the high impedance state at a signal through the corresponding channel of the override bus 58. This feature is additional to the internally programmable Hi Z channel 74.

The apparatus according to the invention is operative in three modes under program control. Each pin may accept a repeatable sequence of iterations or steps in a nonrepetitive chain of up a 2048 steps. Specifically, each pin 13 may be programmed to accept a predefined set of sequences through the 240 × 2048 bit SSRAM 30, or to accept synthesized pseudo-random sequence through the ASP 32, or to accept a combination of test sets, all under internal control or under control of the unit under test. In particular, pins 13 may be programmed to receive data supplied by the UUT 20 for interaction with the stored program and for error analysis. In addition, some of the pins may be interconnected with auxiliary boards or so-called "personality boards" which provide to the TSP 28 and to background software such functions as external clock control, real time data on the expected performance characteristics of the UUT 20, or digital interconnection information for proper interface of the tester and UUT 20.

The invention has been described with reference to specific embodiments. Other embodiments will be apparent to these of ordinary skill in the art in light of this disclosure. Therefore, it is not intended that this invention be limited except as indicated by the appended claims.

We claim:

1. An apparatus for testing a micro-processor based circuit board having a plurality of input terminals, said apparatus comprising:
   means for generating a plurality of parallel preselected digital sequence patterns;
   means for synthesizing a plurality of parallel pseudo-random digital sequential patterns; and
   means for time multiplexing said digital sequential patterns of said generating means and of said synthesizing means to provide a selected merged sequence of said patterns to said plurality of input terminals.

2. An apparatus according to claim 1 further including means responsive to timing control of said circuit board for regulating the rate of switching of said time multiplexing means.

3. An apparatus according to claim 2 further including means coupled to said time multiplexing means for responding to responses of said circuit board to said merged sequence of patterns for altering the sequence of said patterns.

4. An apparatus according to claim 2 wherein said time multiplexing means comprises:
- a first switching means for directing digital sequence patterns through a first switching level;
- means for preselecting signal routing through said first switching means;
- a second switching means for directing digital sequence patterns through a second switching level and coupled in series between said first switching means and said plurality of input terminals; and
- means coupled to and responsive to said regulating means for selecting a signal routing in said second switching level directing means.

5. An apparatus according to claim 4 further including means for responding to responses of said circuit board to said merged sequence of patterns and wherein said second switching level signal routing selecting means is coupled and responsive thereto for altering the sequence of said patterns.

6. An apparatus for interactive testing of a programmable circuit system having a number of digital signal input and output terminals, a microprocessor unit, and internal timing means, said testing apparatus including:
- first circuit means for interfacing with predetermined input and output terminals of said circuit system;
- second circuit means for controlling sequence of diagnostic steps, each step being determinative of a set of digital signals and circuit conditions for applying to said input terminals and being determinative of circuit conditions established at said output terminals;
- third circuit means coupled to said interfacing means and to said sequence controlling means and responsive to a timing signal of at least one of said internal timing means and to said sequence controlling means for synchronizing successions of said sequence of diagnostic steps;
- fourth circuit means connectable to said interfacing means for providing a first digital signal at selected diagnostic steps;
- fifth circuit means connectable to said interfacing means for providing a second digital signal different from said first digital signal at selected diagnostic steps; and
- switching means coupled to said sequence controlling means for connecting and disconnecting, through said interfacing means, said first and second digital signals to selected ones of said input terminals at selected diagnostic steps.

7. An interactive test apparatus according to claim 6 further including sixth circuit means connectable to said interfacing means for providing a high impedance at said input and said output terminals and wherein said switching means is further operative to connect said high impedance to selected of said input and output terminals in response to said sequence controlling means.

8. An interactive test apparatus according to claim 6 wherein said sequence controlling means is further responsive to digital output signals generated under control of said circuit system under test in response to digital signals at said input terminals for selecting the sequence of said diagnostic steps.

9. An apparatus according to claim 6 which further includes external digital data input means connected to said sequence controlling means for preselecting the sequence of said diagnostic steps.

10. An interactive test apparatus according to claim 6 which further includes external digital data input means connected to said sequence controlling means for preselecting the sequence of said diagnostic steps and wherein said sequence controlling means is further responsive to digital output signals generated under control of said circuit system under test in response to digital signals at said input terminals for altering the sequence of said diagnostic steps.

11. An apparatus according to claim 6 wherein said interfacing means includes circuit means for coupling a second said circuit system in parallel with said circuit system under test for comparing operation of said circuit systems for digital signal at input and output terminals.

12. An apparatus according to claim 11 further including diagnostic means for comparing said first circuit system and said second circuit system in real time.

13. An apparatus according to claim 6 further including diagnostic means for generating a signature response to compare said circuit system response with a known valid circuit system response.

14. An apparatus according to claim 13 wherein said diagnostic means is a parallel cyclic redundancy check network.

15. An apparatus according to claim 6 wherein said first digital signal providing means comprises means for storing and delivering a preselected digital sequence.

16. An apparatus according to claim 6 wherein said second digital signal providing means comprises means for synthesizing and delivering a pseudorandom digital sequence.

17. An apparatus for interactive testing of a programmable circuit system having a plurality of digital signal input and output terminals, a microprocessor unit and internal timing means, said testing apparatus comprising:
- an interface for connecting digital signal lines with predetermined input and output terminals of said circuit system;
- a means responsive to digital signals generated at said output terminals for selecting sequence of diagnostic steps, each step being determinative of a set of digital signals and circuit conditions applied to said input terminals and further being determinative of circuit conditions established at said output terminals;
- means responsive to timing signals generated by said internal timing means for regulating rate of succession of said diagnostic steps;
- circuit means for storing and delivering a preselected digital sequence;
- circuit means for synthesizing and delivering a pseudorandom digital sequence;
- means for providing a high impedance circuit terminal condition;
- switching means coupled to said sequence selecting means and further responsive to signals of selected of said output terminals for selectively connecting and disconnecting through said interfacing means said digital sequence storing means, said digital sequence synthesizing means and said high impedance providing means to selected of said input and output terminals for producing a selected merged sequence of digital signals and circuit conditions for exercising and testing said circuit system.

18. A method for testing a circuit system which includes a microprocessor unit having an internal timing means and a plurality of input and output terminals for communicating with the external environment, said method comprising:

interfacing said terminals with a diagnostic apparatus having controlling means, means for providing digital signals at each said input terminal, means for receiving digital signal response at each said terminal, and means for registering the digital state of each said terminal;

selecting a pattern of diagnostic steps, each step defining a circuit condition, a stored digital state or a signal operation for application at an input terminal and a condition for response at an output terminal;

establishing for each said iteration and for each said terminal a digital state, a fixed circuit condition, or a condition for digital signal stimulation according to a pre-selected pattern;

connecting said timing means with said controlling means to establish timing control by said timing means over said controlling means; thereafter executing said pattern of diagnostic steps under control of said controlling means for exercising said circuit system; and registering digital responses of each said terminal for testing of said circuit system.

19. A method according to claim 18 wherein said executing step includes altering said pattern of steps in synchronization with said internal timing means in accordance with preselected responses at said output terminals.

* * * * *